United States Patent [19]

Kotera et al.

[11] Patent Number: 4,857,769
[45] Date of Patent: Aug. 15, 1989

[54] THRESHOLD VOLTAGE FLUCTUATION COMPENSATION CIRCUIT FOR FETS

[75] Inventors: Nobuo Kotera, Kokubunji; Kiichi Yamashita, Kanagawa; Taizo Kinoshita, Kokubunji; Hirotoshi Tanaka, Yamanashi; Satoshi Tanaka, Kokubunji; Minoru Nagata, Kodaira, all of Japan

[73] Assignee: Hitachi, Ltd., Tokyo, Japan

[21] Appl. No.: 143,385

[22] Filed: Jan. 13, 1988

[30] Foreign Application Priority Data

Jan. 14, 1987 [JP] Japan .................................. 62-4829

[51] Int. Cl.[4] .............................................. H03K 17/14
[52] U.S. Cl. ..................................... 307/450; 307/448; 307/577; 307/296.1
[58] Field of Search ................... 307/200 B, 443, 448, 307/450, 571, 572, 575, 577, 584, 296 R, 297; 357/22.6, 23.3, 23.12

[56] References Cited

U.S. PATENT DOCUMENTS

| | | | |
|---|---|---|---|
| 3,986,060 | 10/1976 | Nishizawa et al. | 307/200 B X |
| 4,609,833 | 9/1986 | Guterman | 307/296 R X |
| 4,661,726 | 4/1987 | Biard | 307/450 |
| 4,760,284 | 7/1988 | Taylor | 307/296 R |
| 4,760,288 | 7/1988 | Peczalski | 307/450 X |

Primary Examiner—David Hudspeth
Attorney, Agent, or Firm—Antonelli, Terry & Wands

[57] ABSTRACT

This invention relates to a threshold voltage detection circuit for detecting the threshold voltage of field effect transistors (FETs) and to a semiconductor circuit capable of a stable operation irrespective of the fluctuation of the threshold voltage by utilizing this threshold voltage detection circuit. The source-drain path of first FET is connected in series with that of second FET having substantially the same threshold voltage as that of the first FET and the conductances of these first and second FETs are set to a predetermined ratio to generate a voltage drop associated with the threshold voltage in the first FET. This voltage drop can be used for detecting the threshold voltage and for level-shifting. The output of the series connection of the first and second FETs is applied to the gate of a constant current FET having the same threshold voltage as that of the first and second FETs and the drain current of the constant current FET can thus be set irrespective of the fluctuation of the threshold voltage.

23 Claims, 8 Drawing Sheets

THRESHOLD VOLTAGE FLUCTUATION COMPENSATION CIRCUIT FOR FETS

BACKGROUND OF THE INVENTION

1. Field of the Invention

This invention relates generally to semiconductor circuits composed of field effect transistors (hereinafter called "FETs"), and more particularly to semiconductor circuits which will be suitable for taking out a signal proportional to the threshold voltage of FETs formed in an integrated circuit (hereinafter called the "IC").

1. Description of the Prior Art

When a voltage above a threshold voltage $V_{TH}$ of an FET is applied to its gate, a current flows through its drain-source path and the FET can therefore be used for signal amplification or signal processing.

However, the threshold voltage $V_{TH}$ of FET fluctuates on an order of from 10 to the 200 mV due to fabrication process of IC. It also changes at a rate of about 1.5 mV/°C. with the operation temperature of the IC. At this time, $V_{TH}$ changes by about 150 mV with a temperature difference of 100° C. Furthermore, $V_{TH}$ of the FET changes wth the change of the gate length $L_g$ due to the short channel effect. If FETs each having a varying $L_g$ are used, $V_{TH}$ varies within the same wafer and moreover, the fluctuation of $V_{TH}$, that is, $\Delta V_T$, occurs for the fabrication fluctuation of the gate length, that is, $\Delta L_g$, in the FET group having the same rating.

If $V_{TH}$ changes or fluctuates in the manner described above, transistor characteristics and the operating point fluctuate, too, so that circuit design becomes extremely difficult. In Si MOSFETs, efforts have been made to eliminate these adverse influences by taking into consideration various design margins. For example, "ISSCC, Digest of Technical Papers (1976)", pp. 54–55 describes an attempt which applies feedback to the potential of a well portion, in which a transistor is buried, and compresses $\Delta V_{TH}$ in order to restrict the fluctuation of $V_{TH}$ (corresponding to the change of $\Delta V_{TH}$ to $\Delta V_{TH} \neq 0$) when $L_g$ is around 2 μm.

The drop of the circuit operation margin due to the fluctuation of the threshold voltage becomes a more critical problem from the aspect of circuit design because signal amplitude as well as power supply voltage must be reduced with a higher operation speed of the circuit and its lower power consumption. The necessity for eliminating the influences of the threshold voltage fluctuation $\Delta V_{TH}$ is particularly high in those circuits which use GaAs MESFETs. An attempt has been made conventionally to increase the margin of the circuit itself in order to cope with this problem, but no attempt has been made so far to stabilize the IC operation by use of a circuit for directly detecting the threshold voltage $V_{TH}$ or its fluctuation.

SUMMARY OF THE INVENTION

The fluctuation of the threshold voltage $V_{TH}$ of FET occurs fundamentally because of (1) fluctuation of ICs during fabrication, (2) temperature change during use and (3) potential change of other transistor terminals connected through a substrate back bias voltage inside the IC or substrate. Therefore, the $V_T$ fluctuation due to the fabrication fluctuation and particularly due to the short channel effect has become a serious problem nowadays because the gate length $L_g$ of FET has been reduced (to the order of submicron) in order to obtain higher FET characteristics.

The fluctuation of the threshold voltage $V_{TH}$ of an FET itself is an unavoidable phenomenon. Nonetheless, threshold voltage detection for picking up a signal proportional to the threshold voltage of FET is necessary in order to operate stably voltage-wise or current-wise a semiconductor circuit constituted by FETs.

It is therefore the first object of the present invention to provide a semiconductor circuit for generating a signal proportional to the threshold voltage $V_{TH}$ of an FET.

It is the second object of the present invention to provide a semiconductor circuit which generates a signal proportional to the threshold voltage $V_{TH}$ of FET and can operate stably voltage-wise or current-wise irrespective of the fluctuation of the threshold voltage by utilizing this signal. These and other objects and novel features of the present invention will become more apparent from the following description when taken in conjunction with the accompanying drawings.

In order to generate a signal proportional to the threshold voltage $V_{TH}$ of FET, first and second FETs having substantially the same threshold voltage $V_{TH}$ are used, and the drain-source path of this first FET is connected in series to that of second FET. Here, the term "substantially the same $V_{TH}$" means that these two transistors are formed by the same fabrication process on an IC substrate in the proximity with each other or adjacent to each other, for example.

The conductance of first FET and that of the second FET are set to a predetermined ratio. Then, the first FET generates an electrical output containing the signal proportional to the threshold voltage $V_{TH}$ described above.

DESCRIPTION OF THE PREFERRED EMBODIMENTS

The principle characteristics of an FET will be explained prior to the description of the embodiments of the present invention.

If the relationship of the following formula (A) is satisfied, the drain current $I_D$ of an FET is given by the following formula (B) and the FET operates in a linear region (triode region), assuming that the threshold voltage, gate-source voltage, drain-source voltage and conductance constant of the FET are $V_{TH}$, $V_{GS}$, $V_{DS}$ and K, respectively:

$$V_{GS} - V_{TH} < V_{DS} \quad (A)$$

$$I_D = K \cdot V_{DS} \cdot [2(V_{GS} - V_{TH}) - V_{DS}] \quad (B)$$

On the other hand, if the relationship of the following formula (C) is established, the drain current $I_D$ of the FET is given by the formula (D), and the FET operates in a saturation region (pentode region):

$$V_{GS} - V_{TH} \leq V_{DS} \quad (C)$$

$$I_D = K \cdot (V_{GS} - V_{TH})^2 \quad (D)$$

The embodiments of the present invention will be described in detail on the basis of the understanding of the principle characteristics of an FET described above.

Figure 1:
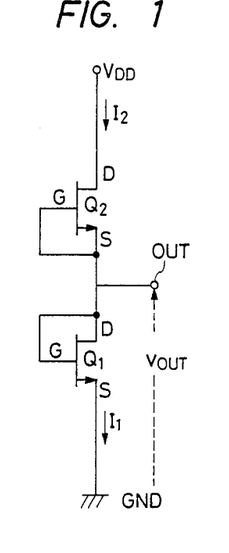
FIGS. 1 and 2 are circuit diagrams showing threshold voltage detection circuits in accordance with the first and second embodiments of the present invention, respectively.

FIG. 1 shows a circuit diagram of a threshold voltage detection circuit in accordance with the first embodiment of the present invention.

Both first and second FETs $Q_1$ and $Q_2$ are N-channel depletion mode FETs and are fabricated on an IC substrate in the proximity of each other by the same fabrication process. Therefore, the threshold voltages $V_{TH1}$ and $V_{TH2}$ of these transistors $Q_1$ and $Q_2$ have the following equal negative value $-V_{th}$:

$$V_{TH1} = V_{TH2} = V_{TH} = -V_{th} \quad (1)$$

The source of $Q_1$ is connected to the earth ground potential and its gate and drain are short-circuited and connected to an output terminal OUT. The drain of $Q_2$ is connected to a positive power supply voltage $V_{DD}$ and its gate and source are short-circuited and connected to a output terminal OUT.

Since first FET $Q_1$ is the depletion mode FET and its gate and drain are short-circuited, this transistor $Q_1$ operates in the linear region and its drain current $I_1$ is given by the following equation:

$$\begin{aligned} I_1 &= K_1 \cdot V_{GS1} \cdot [2(V_{GS1} - V_{TH1}) - V_{DS1}] \\ &= K_1 \cdot V_{out}[2(V_{out} - (-V_{th})) - V_{out}] \\ &= K_1 \cdot V_{out} \cdot (V_{out} + 2V_{th}) \end{aligned} \quad (2)$$

If the positive power supply voltage $V_{DD}$ has a sufficiently large value, second FET $Q_2$ operates in the saturation region and its drain current $I_2$ is given by the following equation:

$$\begin{aligned} I_2 &= K_2 \cdot (V_{GS2} - V_{TH2})^2 \\ &= K_2 \cdot (0 - (-V_{th}))^2 \\ &= K_2 \cdot V_{th}^2 \end{aligned} \quad (3)$$

If the flow-in or flow-out of the current does not occur substantially at the output terminal OUT, the relationship $I_1 = I_2$ is established and the following equation can be obtained:

$$K_1 \cdot V_{out}^2 + 2K_1 \cdot V_{th} \cdot V_{out} - K_2 V_{th}^2 = 0$$

$$V_{out}^2 + 2V_{th} \cdot V_{out} - \beta V_{th}^2 = 0 \quad (4)$$

where $\beta = K_2/K_1$.

Therefore, the output voltage is given as follows from equation (4):

$$\begin{aligned} V_{out} &= \frac{-2V_{th} \pm \sqrt{4V_{th}^2 + 4\beta V_{th}^2}}{2} \\ &= -V_{th} \pm V_{th}\sqrt{1 + \beta} \end{aligned} \quad (5)$$

On the other hand, $V_{out}$ should become small when $\beta = 0$ and should become large when $\beta$ is great. Therefore, equation (5) becomes as follows:

$$V_{out} = -V_{th} + V_{th}(\sqrt{\beta + 1}) \quad (6)$$

$$= (\sqrt{\beta + 1} - 1) \cdot |V_{TH}| \quad (7)$$

As can be understood from above, the signal $V_{out}$ associated with the threshold voltages $V_{TH} = -V_{th}$ of first and second FETS $Q_1$ and $Q_2$ can be taken out from the output OUT of the circuit shown in FIG. 1. It can be understood, too, that if $\beta = 3$ in equation (7), $V_{out} = V_{th} = |V_{TH}|$.

Figure 2:
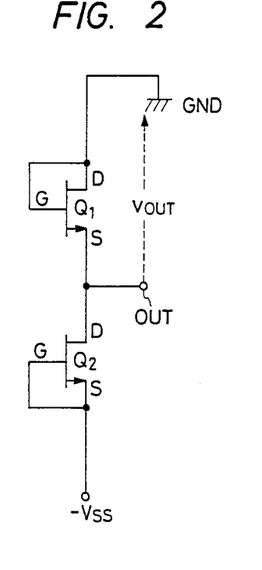
Figure 3:
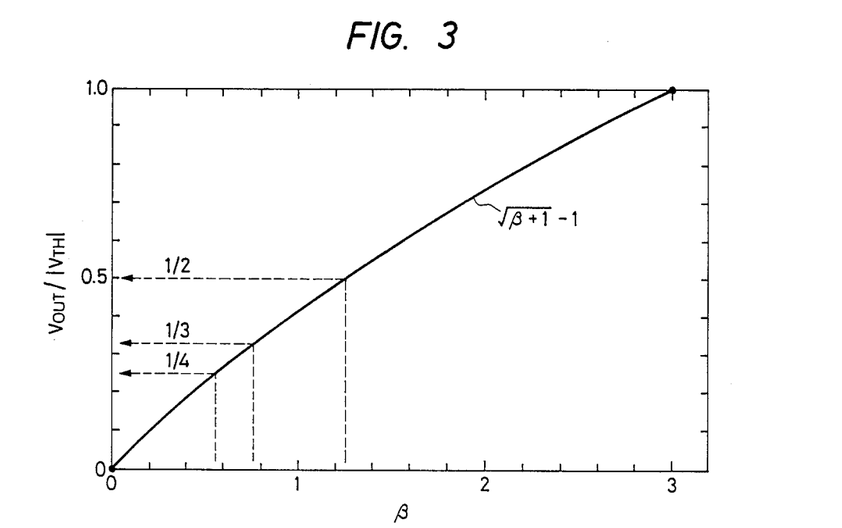
FIGS. 3 and 4 are characteristic diagrams showing the design conditions of the first and second embodiments, respectively.

FIG. 2 shows the circuit diagram of the threshold voltage detection circuit in accordance with the second embodiment of the present invention. The gate and drain of $Q_1$ are short-circuited and connected to the earth potential GND. The source of $Q_1$ is connected to the output terminal OUT and the drain of $Q_2$ is connected to the output terminal, too. The gate and source of $Q_2$ are short-circuited and connected to the negative power supply voltage $-V_{ss}$ and this is the difference from the circuit of the first embodiment shown in FIG. 1 with the other being the same. Therefore, since $Q_1$ and $Q_2$ operate in the linear region and in the saturation region in FIG. 2, respectively, so that equation (1) through (4) described above is established and the output $V_{out}$ is also given by equation (5) through (7).

It can be understood that (1) the output voltage $V_{out}$ in FIGS. 1 and 2 is proportional to the absolute value $|V_{TH}|$ of the threshold voltage and (2) its proportional constant is given by $(\sqrt{\beta+1}-1)$. This value can be adjusted by changing the dimensional ratio (that is, the ratio of the channel width) of FET so as to change $\beta$. In other words, the proportional constant $(\sqrt{\beta+1}-1)$ changes with respect to the dimensional ratio $\beta$ (FET gate width ratio) as shown in FIG. 2. In order to obtain $V_{out}/|V_{TH}|-1$, design must be made so that $\beta=3$.

In Si MOSFETs in general, an arbitrary gate voltage $V_{GS}$ can be provided within the permissible range of the gate withstanding voltage or within the range where the hot electron effect is not much vigorous. In contrast, in those FETs which utilize the Schottky barrier such as GaAs MESFETs or in those FETs which utilize the p—n junction barrier such as Si JFETs, a forward current flows through the gate if a forward voltage is applied to the barrier and the transistor action is lost. If such a critical gate voltage is called $V_f$, the following relation must be satisfied generally:

$$V_{GS} < V_f \quad (8)$$

This $V_f$ value is about 0.6 V in n-channel GaAs MESFETs. In the circuits shown in FIGS. 1 and 2, design must be made for the transistor $Q_1$ exhibiting the triode function so as to satisfy the condition of equation (8). Since $V_{out} = V_{DS1} = V_{GS1}$ in this wiring, the following condition is necessary:

$$(\sqrt{\beta+1}-1)|V_{TH}| < V_f \quad (9)$$

If $V_f = 0.6$ V, $\beta$ must be selected so that the following relationship is satisfied:

$$|V_{TH}| < 0.6 \text{ V}/(\sqrt{\beta+1}-1) \quad (10)$$

Figure 4:
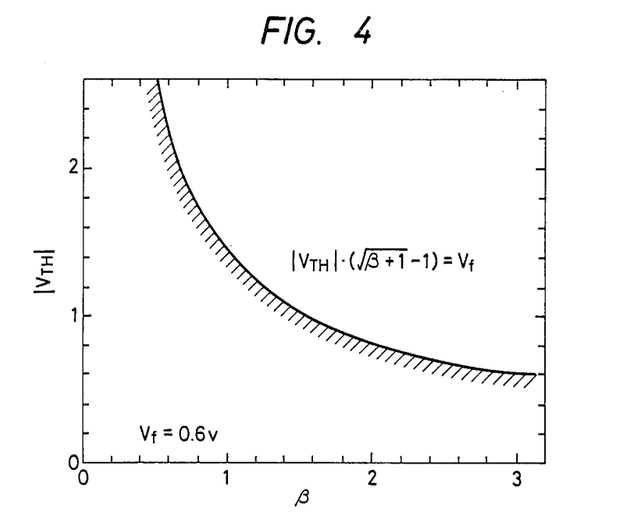

This region is the region with oblique lines in FIG. 4. In ordinary design which makes $V_{out}$ equal to $|V_{TH}|$, the following condition must be satisfied:

$$V_{out} = |V_{TH}| < V_f \quad (11)$$

In other words, there occurs the critical limit condition that $|V_{TH}|$ detected by the threshold voltage detection circuit must not exceed $V_f$.

This limit condition can be mitigated by a circuit arrangement wherein a plurality of transistors corresponding to $Q_1$ are connected in series.

Figure 5:
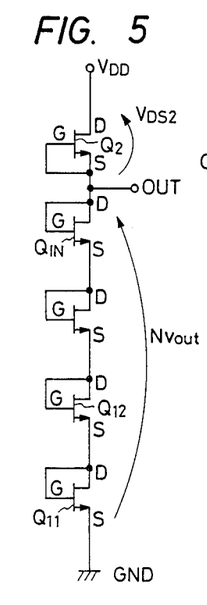
FIGS. 5 and 6 are circuit diagrams showing threshold voltage detection circuits in accordance with the third and fourth embodiments of the present invention, respectively.
Figure 6:
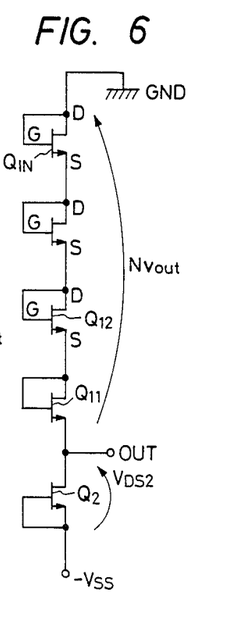

FIGS. 5 and 6 show the third and fourth embodiments of the present invention, respectively.

Namely, the triode operation transistor $Q_1$ of the depletion mode shown in FIGS. 1 and 2 is substituted by N depletion mode transistors $Q_{11}, Q_{12}, \ldots, Q_{1N}$ that are adjacent to one another. It will be hereby assumed that these transistors $Q_1$, $Q_{11}$ have the same device parameters and dimension and are fabricated by the same fabrication process. At this time, since the output voltage becomes N times, it can be expressed as follows:

$$NV_{out} = N(\sqrt{\beta+1}-1) \cdot |V_{TH}| \quad (12)$$

In accordance with ordinary design wherein $NV_{out} = |V_{TH}|$, the design condition must be selected so as to satisfy the following relation:

$$N(\sqrt{\beta+1}-1) = 1 \quad (13)$$

Figure 7:
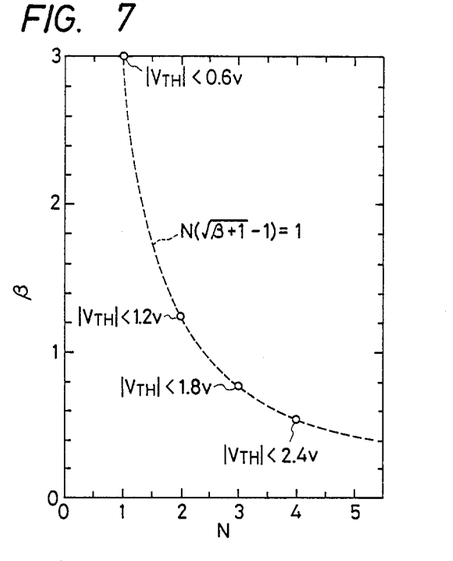
FIGS. 7 and 8 are characteristic diagrams showing the design conditions of the third and fourth embodiments, respectively.

The $\beta$ values that satisfy equation (13) for the number of series connection N=1, 2, 3, 4 and 5 are $\beta = 3.0, 1.25, 0.777, 0.563$ and $0.44$, respectively. This design condition is shown by the diagram of FIG. 7.

According to this design method, the output voltage $(V_{out} = V_{DS1} = V_{GS1})$ borne by one transistor is given as follows:

$$V_{out} = |V_{TH}|/N \quad (14)$$

Accordingly, the stricit limit condition of equation (13) imposed on MESFET and JFET is mitigated by N times and $|V_{TH}|$ can be selected within the following range:

$$|V_{TH}| < NV_f \quad (15)$$

In FIG. 7, the numeric values within the $|V_{TH}|$ permissible range are put at the design points of N=1, 2, 3 and 4. The range of detection of the voltage fluctuation becomes broader with a broader $|V_{TH}|$ permissible range. Therefore, series connection of N FETs is an effective circuit design method.

When series connection of N transistors is used, the limit condition relating to the power supply voltage can be obtained in the following manner in the wiring shown in FIG. 6. Namely, the source-drain voltage applied to the transistor $Q_2$ is as follows:

$$V_{DS2} = |V_{ss}| - N(\sqrt{\beta+1}-1)|V_{TH}| \quad (16)$$

The condition necessary for $Q_2$ to exhibit the pentode function is $V_{DS2} > |V_{TH}|$. Therefore, the power supply voltage must satisfy the following condition:

$$|V_{ss}| > [1 + N(\sqrt{\beta+1}-1)]|V_{TH}| \quad (17)$$

Figure 8:
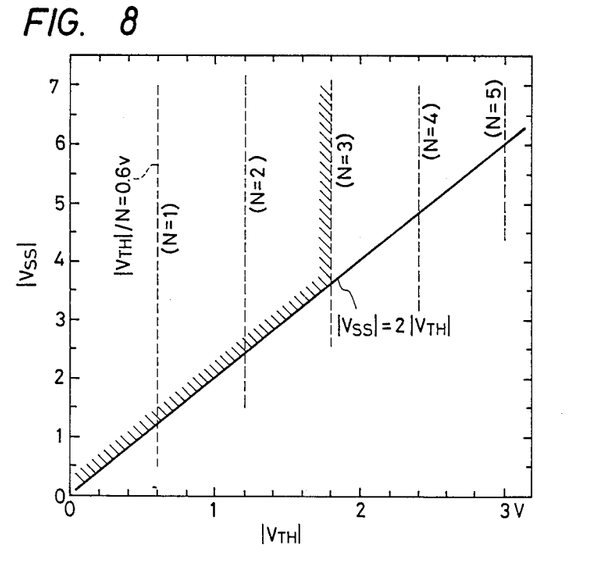

It can be understood from the formula (15) in association with the formula (17) that the operative range of this circuit is the region with oblique lines in FIG. 8 in the space on the coordinates of $|V_{ss}|$ and $|V_{TH}|$. Here, the case where the formula (13) is satisfied and $V_f = 0.6$ V is dealt with in FIG. 8. For example, when N=3, the threshold voltage can be detected with $|V_{TH}| < 1.8$ V being the limit. At this time, the power supply voltage $V_{ss}(<0)$ must satisfy the condition $|V_{ss}| > 2|V_{TH}|$. If $|V_{TH}| = 1.0$, $|V_{ss}|$ must be sufficiently greater than 2.0 V. If the power supply voltage is 5.2 V, a sufficient power supply voltage margin can be secured. In the case of the wiring shown in FIG. 5, the formulas (16) and (17) can be applied as such if $|V_{ss}|$ is substituted by $|V_{DD}|$. As described above, in accordance with the wirings shown in FIGS. 5 and 6, the limit to the voltage detectable range encountered in MESFETs and JFETs can be mitigated and $|V_{TH}|$ can be detected in a broad range.

Figure 9:
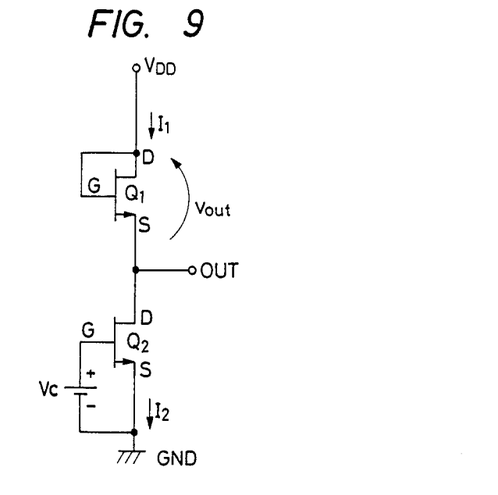
FIG. 9 is a circuit diagram showing the threshold voltage detection circuit in accordance with the fifth embodiment of the present invention.

FIG. 9 shows the circuit diagram of the threshold voltage generation circuit in accordance with the fifth embodiment of the present invention. Both the first and second FETs $Q_1$ and $Q_2$ are N-channel enhancement mode FETs and are fabricated adjacent to each other on the IC substrate by the same fabrication process. Therefore, the threshold voltages $V_{TH1}$ and $V_{TH2}$ of $Q_1$ and $Q_2$ assume the following equal positive value $V_{th}$:

$$V_{TH1} = V_{TH2} = V_{th} \quad (17)$$

The gate and drain of $Q_1$ are short-circuited and connected to the positive power supply voltage $V_{DD}$ while its source is connected to the output terminal OUT. The drain of $Q_2$ is connected to the output terminal OUT while the source of $Q_1$ is connected to the earth potential GND. The control voltage $V_c$ is applied to the gate of $Q_2$.

The first FET $Q_1$ is the enhancement mode FET and its gate and drain are short-circuited. Accordingly, the first $Q_1$ operates in the saturation region and its drain current $I_1$ is given by the following equation:

$$I_1 = K_1 (V_{GS1} - V_{TH1})^2 \qquad (18)$$
$$= K_1 (V_{out} - V_{th})^2$$

If the positive power supply voltage is a sufficiently large value, the second FET $Q_2$ operates in the saturation region and its drain current $I_2$ is given by the following equation:

$$I_2 = K_2 (V_{GS2} - V_{TH2})^2$$
$$= K_2 (V_c - V_{th})^2$$

If flow-in or flow-out of the current does not occur substantially at the output terminal OUT, the relationship $I_1 = I_2$ is established; hence, the following equation can be obtained:

$$K_1 \cdot V_{out}^2 - 2K_1 V_{th} V_{out} + K_1 V_{th}^2 - K_2(V_c - V_{th})^2 = 0$$

$$V_{out}^2 - 2V_{th} V_{out} + V_{th}^2 - \beta(V_c - V_{th})^2 = 0 \qquad (19)$$

where $\beta = K_2/K_1$

From equation (19), the output voltage can be given as follows:

$$V_{out} = \frac{2V_{th} \pm \sqrt{4V_{th}^2 - 4[V_{th}^2 - \beta(V_c - V_{th})^2}}{2} \qquad (20)$$
$$= V_{th} \pm \sqrt{\beta} (V_c - V_{th})$$

On the other hand, $V_{out}$ should assume a small value if $\beta = 0$ and a large value if $\beta$ is great. Therefore, equation (20) can be modified as follows:

$$V_{out} = V_{th} + \sqrt{\beta} (V_c - V_{th}) \qquad (21)$$
$$= \sqrt{\beta} V_c + (1 - \sqrt{\beta}) V_{th}$$

As described above, the signal $V_{out}$ associated with the threshold voltages $V_{TH} = V_{th}$ of the first and second transistors $Q_1$ and $Q_2$ can be taken out from the output terminal OUT of the circuit shown in FIG. 9. If $\beta = 4$ in equation (21), it can be understood that $V_{out} = 2V_c - V_{th}$.

The limit condition imposed on the power supply voltage so that the circuit shown in FIG. 9 can operate is as follows. As to the transistor $Q_1$, since $V_{DS1} = V_{GS1}$, the necessary condition for the pentode operation, i.e. $V_{DS} \geq (V_{GS} - V_{TH})$ is always satisfied in view of $V_{TH} > 0$. As to the transistor $Q_2$, $V_{GS2} = V_c$ and $V_{DS2} = V_{DD} - V_{out}$ from the circuit shown in FIG. 5. Therefore, the following relation $$V_{DD} \geq (1 + \sqrt{\beta}) V_c \sqrt{\beta} \cdot V_{TH} \qquad (22)$$

must be satisfied. Since $V_c$ and $V_{TH}$ are generally up to 0.6 V, the condition of the formula (22) can be satisfied easily so long as $V_{DD}$ is approximately 5 V.

In JFETs and MESFETs other than MOSFETs, the condition $V_{GS} < V_f$ must be satisfied in the same way as the formula (8). Accordingly, the following two conditions must be satisfied in the circuit shown in FIG. 5:

$$V_{out} < V_f \qquad (23)$$

$$V_c < V_f \qquad (24)$$

Figure 10:
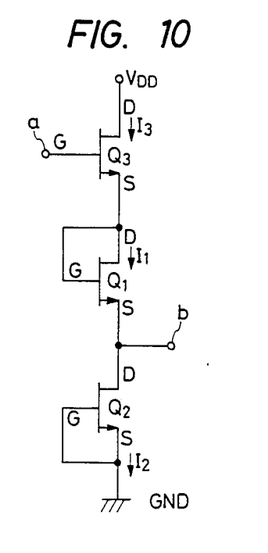
FIG. 10 is a circuit diagram showing a source-follower circuit in accordance with the sixth embodiment of the present invention.

FIG. 10 shows the circuit diagram of a source-follower circuit in accordance with the sixth embodiment of the present invention. First, second and third FETs $Q_1$, $Q_2$ and $Q_3$ are N-channel depletion mode transistors FETs and are fabricated on the IC substrate adjacent to one another by the same fabrication process. Therefore, the threshold voltages $V_{TH1}$, $V_{TH2}$ and $V_{TH3}$ of these transistors assume the following equal negative value $-V_{th}$:

$$V_{TH1} = V_{TH2} = V_{TH3} = V_{TH} = -V_{th} \qquad (25)$$

The drain of $Q_3$ is connected to the positive power supply voltage $V_{DD}$ and its gate is connected to the input terminal a. The source of $Q_3$ is connected to the gate and drain of $Q_1$ and the source of $Q_1$ is connected to the output terminal b and to the drain of $Q_2$. The gate and source of $Q_2$ and short-circuited and connected to the earth voltage GND.

When the power supply voltage $V_{DD}$ is sufficiently great, the third FET $Q_3$ operates in the saturation region and the first and second FETs $Q_1$ and $Q_2$ operate in the linear region for the same reason as in the embodiment shown in FIG. 1. Therefore, the drain currents $I_1$, $I_2$ and $I_3$ of $Q_1$, $Q_2$ and $Q_3$ are given by the following equations, respectively:

$$I_1 = K_1 \cdot V_{GS1} \cdot [2(V_{GS1} - V_{TH1}) - V_{DS1}] \qquad (26)$$
$$= K_1 \cdot V_{GS1} \cdot (V_{GS1} + 2V_{th})$$

$$I_2 = K_2 \cdot (V_{GS2} - V_{TH2})^2 \qquad (27)$$
$$= K_2 \cdot (V_{th})^2$$

$$I_3 = K_3 \cdot (V_{GS3} - V_{TH3})^2 \qquad (28)$$
$$= K_3 \cdot (V_{GS3} + V_{th})^2$$

If flow-in or flow-out of the current does not occur substantially at the output terminal OUT, the relation $I_1 = I_2 = I_3$ is established. Therefore, if $K_2 = K_3$, $V_{GS3} = 0$ from the equations (27) and (28).

On the other hand, the following relation can be established from the equations (26) and (27):

$$K_1 V_{GS1}^2 + 2K_1 V_{th} V_{GS1} - K_2 V_{th}^2 = 0$$

$$V_{GS1}^2 + 2V_{th} V_{GS1} - \beta V_{th}^2 = 0 \qquad (29)$$

where $\beta = K_2/K_1$

Therefore, $V_{GS1}$ is given by the following equation in the same way as the equations (5), (6) and (7):

$$V_{GS1} = -V_{th} + V_{th}(\sqrt{\beta + 1}) \quad (30)$$

$$= (\sqrt{\beta + 1} - 1) \cdot |V_{TH}| \quad (31)$$

Therefore, if $\beta=3$, $V_{GS1}=V_{th}$ and if $\beta=8$, $V_{GS}=2V_{th}$. If $\beta=15$, $V_{GS}=3V_{th}$ and a voltage which is some multiples of $V_{th}$ can be obtained across both ends of the first FET $Q_1$.

If the voltage at the input terminal a is $V_a$ and the voltage at the output terminal b is $V_b$, then $$V_b = V_a - V_{GS1} \quad (32)$$
$$= V_a - (\sqrt{\beta + 1} - 1)V_{th}$$

If $\beta=3$, $$V_b = V_a - V_{th} \quad (33)$$

It can be thus understood that the embodiment shown in FIG. 10 operates as a level shift circuit having a level shift voltage which is some multiples of $V_{th}$.

Figure 11:
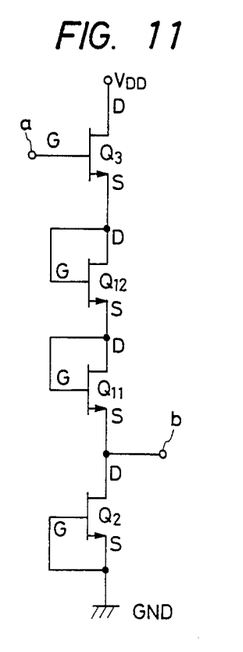
FIG. 11 is a circuit diagram showing a source-follower circuit in accordance with the seventh embodiment of the present invention.

FIG. 11 shows the circuit diagram of the source-follower circuit in accordance with the seventh embodiment of the present invention. This circuit is different from the circuit shown in FIG. 10 in that $Q_1$ of FIG. 10 is substituted by two FETs $Q_{11}$ and $Q_{12}$. However, the operation of the circuit of FIG. 11 is the same in principle as that of FIG. 10.

Figure 12:
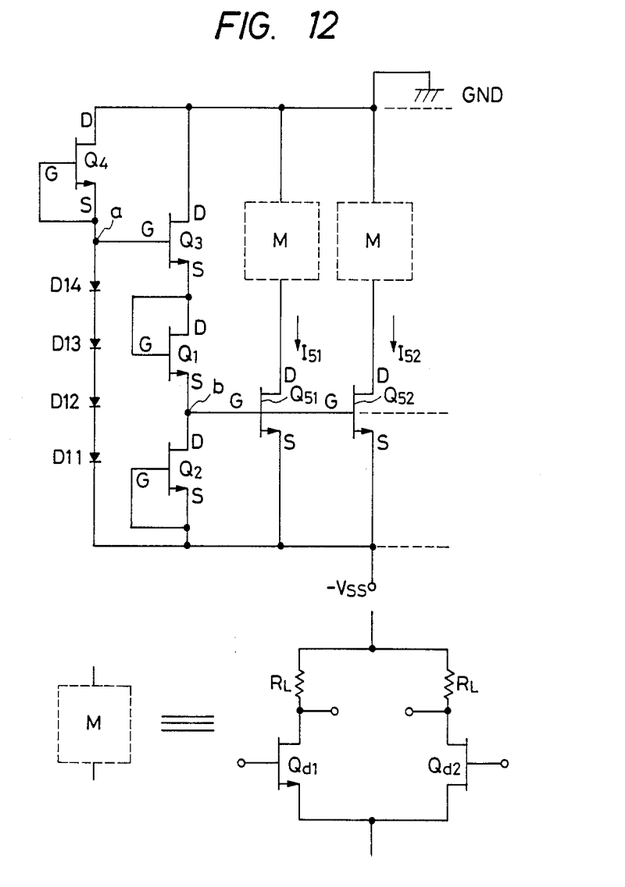
FIG. 12 is a circuit diagram showing a constant current circuit in accordance with the eight embodiment of the present invention.

FIG. 12 shows the circuit diagram of a constant current circuit in accordance with the eigth embodiment of the present invention. In the diagram, in addition to the level shift circuit $Q_3$, $Q_1$, $Q_2$ shown in FIG. 10, N-channel depletion mode FETs $Q_4$, $Q_{51}$, $Q_{52}$ and diodes $D_{11}$ to $D_{14}$ are added afresh. Incidentally, FETs $Q_4$, $Q_{51}$ and $Q_{52}$ are adjacent to one another on the IC substrate in the same way as FETs $Q_1$ to $Q_3$ and are fabricated by the same fabrication process. Therefore, their threshold voltages $V_{TH4}$, $V_{TH51}$ and $V_{TH52}$ assume the equal negative value $-V_{th}$.

Since FET $Q_4$ operates in the saturation region, the following current flows through the drain-source path and the diodes $D_{11}$-$D_{14}$:

$$I_4 = K_4 \cdot (V_{GS4} - V_{TH4})^2 = K_4(V_{th})^2 \quad (34)$$

The diodes $D_{11}$ to $D_{12}$ operate as constant voltage elements and due to the constant current described above, a constant voltage $V_a$ having high stability develops between the anode of $D_{14}$ and the cathode of $D_{11}$.

If $\beta=3$ in the same way as in the embodiment shown FIG. 10, the output voltage $V_b$ at the source of FET $Q_1$ is $V_b=V_a-V_{th}$. This voltage $V_b$ is applied to the gate of the constant current FETs $Q_{51}$ and $Q_{52}$, and their drain currents $I_{51}$ and $I_{52}$ are given by the following equations, respectively:

$$I_{51} = K_{51}(V_{GS51} - V_{TH51})^2 \quad (35)$$
$$= K_{51}(V_a - V_{th} - (-V_{th}))^2$$
$$= K_{51} \cdot V_a^2$$

$$I_{52} = K_{52}(V_{GS52} - V_{TH52})^2 \quad (36)$$
$$= K_{52} \cdot V_a^2$$

It can be thus understood that the drain currents $I_{51}$ and $I_{52}$ are irrelevant to the threshold voltage $V_{TH}=-V_{th}$ of FET.

The functional circuit M shown in FIG. 12 is a differential amplifier circuit having FETs $Q_{d1}$, $Q_{d2}$ and two loads $R_L$ as shown in the drawing. It can be therefore understood that the constant current FETs $Q_{51}$, $Q_{52}$ operate as the current source for the differential FET.

Figure 13:
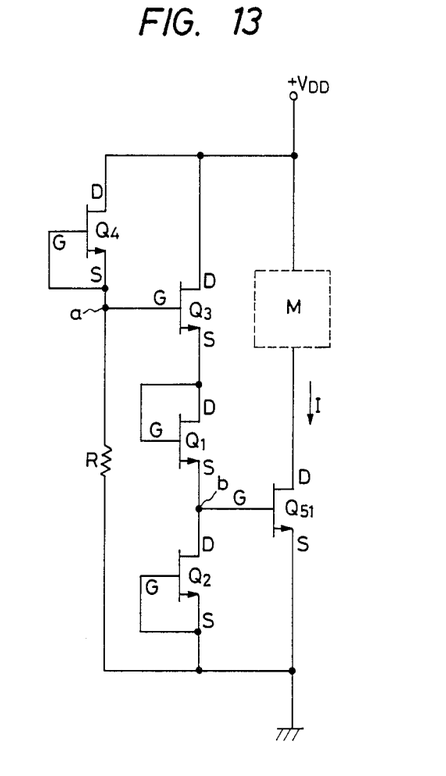
FIG. 13 is a circuit diagram showing a constant current circuit in accordance with the ninth embodiment of the present invention.

FIG. 13 shows the circuit diagram of the constant current circuit in accordance with the ninth embodiment of the present invention. In the diagram, the diodes $D_{11}$-$D_{14}$ in FIG. 12 are substituted by a resistor R.

If $\beta=3$ in the same way as in the embodiment shown in FIG. 12, $V_b=V_a-V_{th}$, too, in the embodiment shown in FIG. 13. If $I=I_{51}$ and $K=K_{51}$, the current I flowing through the FET $Q_{51}$ is given as follows from equation (35):

$$I = K \cdot V_a^2 \quad (37)$$

Therefore, if a temperature T changes, the current I changes in accordance with the following formula:

$$(1/I)(dI/dT) = (1/K)(dK/dT) + (2/V_a)(dV_a/dT) \quad (38)$$

Here, K and Va are assumed to be determined by the function of the temperature T. According to experimental examples of GaAs MESFETs, the temperature characteristics of the conductance constant K is expressed as follows:

$$(1/K)(dK/dT) = -3 \times 10^{-3} \deg^{-1} \quad (39)$$

In other words, the temperature characteristics have a negative temperature coefficient of $-0.3\%$/deg. Therefore, in order to accomplish $dI/dT=0$, the following condition must be satisfied:

$$(1/V_a)(dV_a/dT) = -(1/2K)(dK/dT) = 1.5 \times 10^{-3} \deg^{-1} \quad (40)$$

In other words, unless the control voltage Va has a positive temperature coefficient, the negative temperature change of K cannot be compensated for.

According to the experimental examples of GaAs MESFETs, the temperature coefficient of n-type resistor formed by ion implantation method near room temperature is positive and the resistance value R can be expressed as follows:

$$(1/R)(dR/dT) = 9 \times 10^{-4} \deg^{-1} \quad (41)$$

Furthermore, it is known that the FET current (the pentode operation region) $I_R$ that flows when the gate-source of depletion mode FETs in general are short-circuited has a positive temperature coefficient, and that design can be made in such a manner as to satisfy the following relation:

$$(1/I_R)(dI_R/dT) = 6 \times 10^{-4} \deg^{-1} \quad (42)$$

Assuming that FET described above and the resistor R are connected in series as shown in FIG. 13, the drain terminal of this transistor is connected to the power source $V_{DD}$ and the other terminal of the resistor is connected to the earth line, then the potential $V_R$ at the junction between the transistor and the resistor is given by the following equation:

$$V_R = I_R R \tag{43}$$

In this case, the change of $V_R$ with temperature can be given by the following equation:

$$(1/V_R)(dV_R/dT) = (1/I_R)(dI_R/dT) + (1/R)(dR/dT) \tag{44}$$

From eq. (41) and (42), the following relation can be accomplished in GaAs MESFETs (n channel):

$$(1/V_R)(dV_R/dT) = 1.5 \times 10^{-3} \text{deg}^{-1} \tag{45}$$

Accordingly, if the voltage $V_R$ across both ends of the resistor R is applied to the input terminal a of the source-follower circuit as shown in FIG. 13 ($V_a = V_R$), the temperature compensation condition expressed by equation (40) can be satisfied. In other words, $$dI/dT = 0 \tag{46}$$

can be accomplished.

Figure 14:
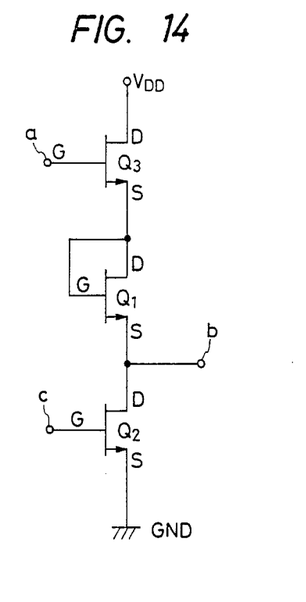
FIG. 14 is a circuit diagram showing a source-follower circuit in accordance with the tenth embodiment of the present invention.

FIG. 14 shows the circuit diagram of the source-follower circuit in accordance with the tenth embodiment of the present invention. First, second and third FETs $Q_1$, $Q_2$ and $Q_3$ are N-channel enhancement mode FETs, are adjacent to one another on the IC substrate and fabricated by the same fabrication process. Therefore, the threshold voltages $V_{TH1}$, $V_{TH2}$ and $V_{TH3}$ of these transistors $Q_1$, $Q_2$ and $Q_3$ assume the following equal positive value $V_{th}$:

$$V_{TH1} = V_{TH2} = V_{TH3} = V_{th} \tag{47}$$

The drain and gate of $Q_3$ are connected to the positive power supply voltage $V_{DD}$ and the input terminal a, respectively, the source of $Q_3$ is connected to the drain and gate of $Q_1$, the source of $Q_1$ is connected to the output terminal b and the drain of $Q_2$ and the gate and source of $Q_2$ are connected to the control input terminal C and the earth potential GND, respectively. Incidentally, the control voltage $V_C$ is applied to the control input terminal C.

If the power supply voltage $V_{cc}$ has a sufficiently large value, all the transistors $Q_1$ to $Q_3$ operate in the saturation region. Therefore, the currents $I_1$, $I_2$ and $I_3$ flowing through these transistors are given by the following equation, respectively:

$$\begin{aligned} I_1 &= K_1(V_{GS1} - V_{TH1})^2 \\ &= K_1(V_{GS1} - V_{th})^2 \end{aligned} \tag{47}$$

$$\begin{aligned} I_2 &= K_2(V_{GS2} - V_{TH2})^2 \\ &= K_2(V_C - V_{th})^2 \end{aligned} \tag{48}$$

$$\begin{aligned} I_3 &= K_3(V_{GS3} - V_{TH3})^2 \\ &= K_3(V_{GS3} - V_{th})^2 \end{aligned} \tag{49}$$

Therefore, $V_{GS1}$ and $V_{GS3}$ are given by the following equation from equation (47) to (49) in the same way as in the embodiment shown in FIG. 9:

$$V_{GS1} = \sqrt{\beta} V_C + (1 - \sqrt{\beta}) V_{th} \tag{50}$$

$$V_{GS3} = \sqrt{\beta'} V_C + (1 - \sqrt{\beta'}) V_{th} \tag{51}$$

where $\beta = K_2/K_1$ and $\beta' = K_2/K_3$

If $\beta = 4$, $V_{GS1} = 2V_C - V_{th}$ from equation (50) and if $\beta' = 1$, $V_{GS3} = V_C$ from equation (51). In this case, the voltage $V_a$ at the input terminal a and the voltage $V_b$ at the input terminal b have the following relation:

$$\begin{aligned} V_b &= V_a - V_{GS1} - V_{GS3} \\ &= V_a - 3V_C + V_{th} \end{aligned} \tag{52}$$

As described above, the source-follower circuit shown in FIG. 14 operates also as a level shift circuit having a level shift quantity associated with the control voltage $V_C$ and the threshold voltage $V_{th}$. Furthermore, as can be understood clearly from equation (52), when the voltage $V_a = 3 V_C$ is applied to the input terminal a, then $V_b = V_{th}$ and the circuit shown in FIG. 12 can be utilized as a threshold voltage detection circuit.

Figure 15:
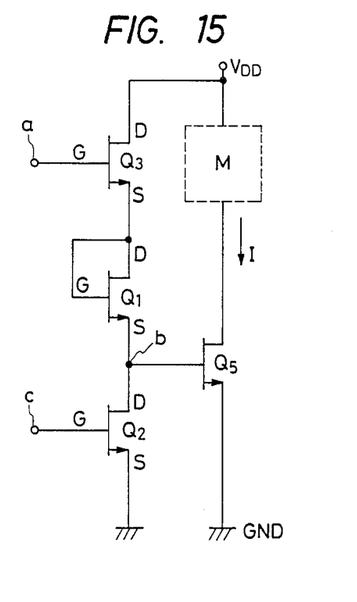
FIG. 15 is a circuit diagram showing a constant current circuit in accordance with the eleventh embodiment of the present invention.

FIG. 15 shows the circuit diagram of the constant current circuit in accordance with the eleventh embodiment of the present invention. In addition to the source-follower circuit $Q_1$–$Q_3$ shown in FIG. 14, an N-channel enhancement mode FET $Q_5$ having a threshold voltage $V_{TH5} = V_{th}$ and a conductance $K_5$ and a functional circuit M are added to the circuit of this embodiment, and furthermore, a voltage $V_C$ is applied to the control input terminal C. A voltage $4 V_C$ is applied to the input terminal a. Then, the voltage $V_b$ at the terminal b is $V_b = V_C + V_{th}$. Therefore, the drain current I of $Q_5$ becomes irrelevant to the threshold voltage $V_{TH} = V_{th}$ of FET as can be understood from the following equation:

$$\begin{aligned} I &= K_5(V_{GS5} - V_{TH5})^2 \\ &= K_5(V_C + V_{th} - V_{th})^2 = K_3 \cdot V_C^2 \end{aligned} \tag{53}$$

Figure 16A:
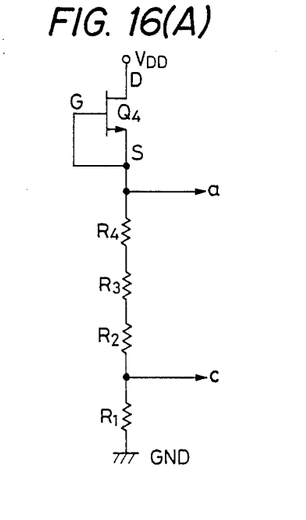
FIGS. 16(A) and 16(B) are circuit diagrams showing definite examples of bias circuits for applying different voltages to the input terminal and control input terminal of the constant current circuit shown in FIG. 15, respectively.
Figure 16B:
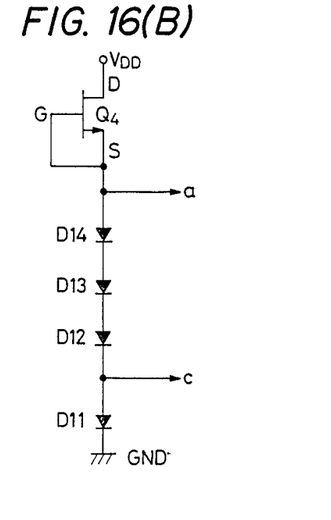

FIGS. 16(A) and 16(B) show definite examples of bias circuits for applying $4 V_C$ and $V_C$ voltages of the input terminal a and control input terminal C of FIG. 15, respectively. $Q_4$ is an N-channel depletion mode FET whose gate and source are short-circuited. In FIG. 16(A), four resistors $R_1$ to $R_4$ are set to an equal resistance value while in FIG. 16(B), four diodes $D_{11}$ to $D_{14}$ are set to equal voltage and current characteristics.

Figure 17:
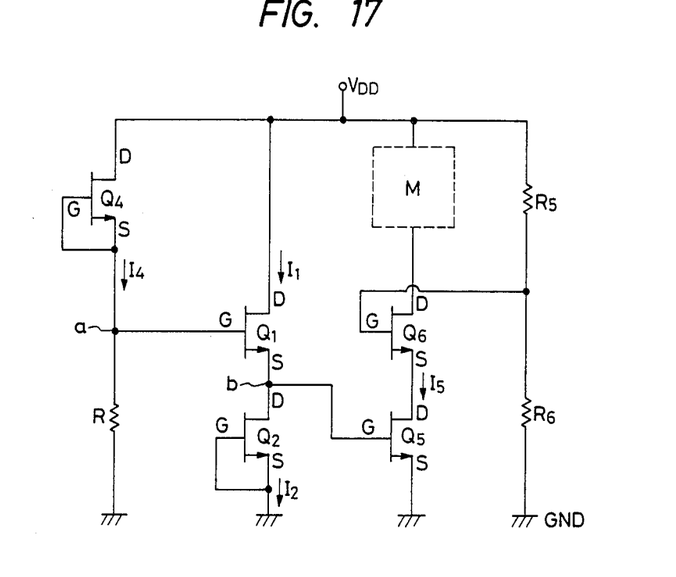
FIG. 17 is a circuit diagram showing a constant current circuit in accordance with the twelfth embodiment of the present invention.

FIG. 17 shows the circuit diagram of the constant current circuit in accordance with the twelfth embodiment of the present invention. FETs $Q_1$ to $Q_5$ are N-channel depletion mode FETs, are adjacent to one another on the IC substrate and fabricated by the same fabrication process. Therefore, the threshold voltages $V_{TH1}$ to $V_{TH5}$ of all the transistors $Q_1$ to $Q_5$ have the following equal negative value $-V_{th}$:

$$V_{TH1} = V_{TH2} = \ldots = V_{TH5} = -V_{th} \tag{54}$$

The drain of $Q_4$ is connected to the positive power supply voltage $V_{DD}$, the gate and source of $Q_4$ are short-circuited and to one of the ends of the resistor $R_4$, and the other end of this resistor $R_4$ is connected to the earth potential GND. The drain of $Q_1$ is connected to the power supply voltage $V_{DD}$, its gate is connected to one of the ends of the resistor $R_1$ and its source is connected to the drain of $Q_2$. The gate and source of $Q_2$ are short-circuited and connected to the earth potential. The source of $Q_5$ is connected to the earth potential, the gate of $Q_5$ is connected to the source of $Q_1$ and the drain of $Q_5$ is connected to the source of $Q_6$. The gate of $Q_6$ is connected to the common connection point of voltage dividing resistors $R_5$ and $R_6$ and the drain of $Q_6$ is connected to the power supply voltage $V_{DD}$ through the functional circuit M.

Since FET $Q_4$ operates in the saturation region, the constant current $I_4$ given by the equation (34) described already flows through the drain-source path of $Q_4$ and the resistor R. Therefore, the voltage drop of $R \cdot I_4$ occurs in the resistor R.

If the power supply voltage $V_{DD}$ has a sufficiently large voltage, FETs $Q_1$ and $Q_2$ operate in the saturation region. Therefore, their drain currents $I_1$ and $I_2$ are given by the following equation:

$$I_1 = K_1(V_{GS1} - V_{TH1})^2 \quad (55)$$
$$= K_1(V_{GS1} + V_{th})^2$$

$$I_2 = K_2(V_{GS2} - V_{TH})^2 \quad (56)$$
$$= K_2(V_{th})^2$$

Since flow-in or flow-out of the current does not occur substantially at the node b, the relation $I_1 = I_2$ is established. Therefore, the following equation can be obtained from equation (55) and (56) with $\beta$ being equal to $K_2/K_1$:

$$K_1 V_{GS1}^2 + 2K_1 V_{th} V_{GS1} + K_1 V_{th}^2 - K_2 V_{th}^2 = 0$$

$$V_{GS1}^2 + 2V_{th} V_{GS1} + V_{th}^2 - \beta V_{th}^2 = 0 \quad (57)$$

$$V_{GS1} = \frac{-2V_{th} \pm \sqrt{4V_{th}^2 - 4(V_{th}^2 - \beta V_{th}^2)}}{2} \quad (58)$$

$$= -V_{th} \pm \sqrt{\beta} \cdot V_{th}$$

On the other hand, when $\beta = K_2/K_1 = 1$, $V_{GS1} = 0$. Therefore, equation (58) can be rewritten as follows:

$$V_{GS1} = (\sqrt{\beta} - 1)V_{th} \quad (59)$$

If $\beta = 4$, therefore, $V_{GS1} = V_{th}$ from equation (59). In this manner, it can be understood that FETs $Q_1$ and $Q_2$ operate not only as the source-follower circuit but also as a level shift circuit having a level shift voltage which is some multiples of the threshold voltage $V_{TH} = -V_{th}$. If the voltages at the nodes a and b are $V_a$ and $V_b$, respectively.

$$V_b = V_a - V_{GS1} \quad (60)$$
$$= V_a - (\sqrt{\beta} - 1) V_{th}$$

Therefore, if $\beta = 4$, $V_b = V_a - V_{th}$. This voltage $V_b$ is applied to the gate of the constant current FET $Q_5$ and its drain current $I_5$ is given by the following equation and is irrelevant to the threshold voltage $V_{TH} = -V_{th}$ of FET as can be understood from the equation:

$$I_5 = K_5(V_{GS5} - V_{TH5})^2 \quad (61)$$
$$= K_5(V_a - V_{th} - (-V_{th}))^2$$
$$= K_5 \cdot V_a^2 = K_5(RI_4)^2$$

This current $I_5$ is supplied to the functional circuit M through the source-drain path of FET $Q_6$. Incidentally, this FET $Q_6$ is disposed in order to prevent the fluctuation of the drain conductance of $Q_5$ with the rise of the power supply voltage $V_{DD}$.

Accordingly, it is possible in this embodiment to accomplish temperature compensation of $dI_5/dT = 0$ by making design in such a manner as to satisfy the following equation:

$$(1/V_a)(dV_a/dT) = -(\tfrac{1}{2}K_5)(dK_5/dT) \quad (62)$$

It is therefore obvious that the constant current circuit having the temperature compensation function is effective in the integrated circuit.

Additionally, the present anvention can be applied generally to FETs such as MOSFETs, MISFETs, JFETs and MESFETs and particularly effectively to IC (integrated circuits).

In accordance with the present invention, it is possible to pick up a threshold voltage or a voltage equal to the absolute value of the threshold voltage by a simple circuit construction formed by combining at least two FETs having substantially the same threshold voltage. It is further possible to constitute a circuit which is not dependent on various threshold voltages by use of this circuit and a control signal generation unit. In this manner, the present invention makes it possible to compensate for the characteristic fluctuation of the circuit resulting from the fluctuation of the threshold voltage that has conventionally been a critical problem with IC. Therefore, the present invention can provide effective means for designing and fabricating IC having stable operation and high performance.

Although the present invention has thus been described in its preferred forms, the invention is not particularly limited thereto but various changes or modifications can be made in the invention without departing from the scope and spirit thereof.

What is claimed is:

1. A semiconductor circuit comprising:
   (1) a plurality of first FETs having source-drain paths thereof connected in series; and
   (2) at least one second FET having the same conductivity type as that of said plurality of first FETs and substantially the same threshold voltage as that of said plurality of first FETs, and having the source-drain path thereof connected in series to the source-drain paths of said plurality of first FETs,
   wherein said plurality of first FETs operate in their linear region, the gates and drains of each of said first FETs being respectively connected electrically,
   wherein said second FET operates in its saturation region, the gate and source of said second FET being connected electrically
   wherein a voltage associated with said threshold voltage can be obtained between the drain and source of said first FETs when the conductances of said first FETs and that of said second FET are set to a predetermined ratio, wherein said first and second FETs are depletion mode FETs, and wherein said conductance ratio of said first and second FETs is set so that said voltage obtained between the drain and source of said first FETs is a predetermined multiple of said threshold voltage.

2. A semiconductor circuit according to claim 1, wherein the total number of said first FETs is set to a value which prevents a forward current from flowing through the gates of a plurality of said first FETs.

3. A semiconductor circuit according to claim 2, wherein said first and second FETs are N-channel depletion mode FETs.

4. A semiconductor circuit comprising:
(1) a first FET; and
(2) a second FET having the same conductivity type as that of said first FET and substantially the same threshold voltage as that of said first FET, and having its source-drain path connected in series with that of said first FET;
wherein said first FET operates in its saturation region, the gate and drain of said first FET being connected electrically;
wherein said second FET operates in its saturation region, a control voltage being applied between the gate and source of said second FET; and
wherein a voltage associated with said threshold voltage can be obtained between the drain and source of said first FET when the conductance of said first FET and that of said second FET are set to a predetermined ratio.

5. A semiconductor circuit according to claim 4, wherein said first and second FETs are enhancement mode FETs.

6. A semiconductor circuit according to claim 5, wherein said conductance ratio of said first and second FETs is set so that said voltage obtained between the drain and souce of said first FET is a predetermined multiple of said threshold voltage.

7. A source-follower circuit comprising:
(1) a plurality of first FETs having source-drain paths thereof connected in series;
(2) a second FET having the same conductivity type as that of said first FETs and substantially the same threshold voltage as that of said first FETs;
(3) a third FET having the same conductivity type as that of said first FETs and substantially the same threshold voltage as that of said first FETs,
wherein the drain of said third FET is connected to a first operating potential point, an input voltage is applied to the gate of said third FET and the source of said third FET is connected to the gate and drain of one of said FETs,
wherein the source of one of said first FETs is connected to an output node and to the drain of said second FET,
wherein said first FETs operate in their linear region, their gate and drains being connected electrically,
wherein said second FET operates in its saturation region, its gate and source being connected electrically,
wherein said third FET operates in its saturation region,
wherein the following level shift voltage associated with said threshold voltage $-V_{th}$ develops between the gate and source of said first FETs when the conductance $K_1$ of said first FETs and the conductance $K_2$ of said second FET is set to a predetermined ratio $\beta = K_2/K_1$:

$$V_{GS1} = -V_{th} + V_{th}(\sqrt{\beta+1})$$

wherein the conductance of said third FET and that of said second FET are set to a substantially equal value, wherein said first, second and third FETs are depletion mode FETs, and wherein the conductances of said first and second FETs are set to said ratio so that said level shift voltage obtained between the drain and source of said first FETs is a predetermined multiple of said threshold voltage.

8. A semiconductor circuit comprising:
(1) a first FET;
(2) a second FET having the same conductivity type as that of said first FET and substantially the same threshold voltage as that of said first FET;
(3) a third FET having the same conductivity type as that of said first FET and substantially the same threshold voltage of said first FET;
(4) constant voltage generation means for generating a constant voltage kept substantially stable from the output terminal thereof, having one and the other ends thereof connected to first and second operating potential points, respectively; and
(5) a constant current FET having the same conductivity type as that of said first FET and substantially the same threshold voltage as that of said first FET, and having its source connected to said second operating potential point;
wherein the drain of said third FET is connected to said first operating potential point, said constant voltage is applied to the gate of said third FET and the source of said third FET is connected to the gate and drain of said first FET;
wherein the source of said first FET is connected to the gate of said constant current FET and to the drain of said second FET;
wherein the source of said second FET is connected to said second operating potential point;
wherein said first FET operates in its linear region, its gate and drain being connected electrically;
wherein said second FET operates in its saturation region, its gate and source being connected electrically;
wherein said third FET operates in its saturation region; and
wherein the conductances of said first, second and third FETs are set so that the current flowing through the drain of said constant current FET is set substantially irrespective of said threshold voltage.

9. A semiconductor circuit according to claim 8, wherein the conductance of said third FET and that of said second FET are set to a substantially equal value.

10. A semiconductor circuit according to claim 9, wherein said first, second and third FETs and said constant current FET are depletion mode FETs.

11. A semiconductor circuit according to claim 10, wherein said conductance ratio of said first and second FETs is set so that the level shift voltage obtained between the drain and source of said first FET is a predetermined multiple of said threshold voltage.

12. A semiconductor circuit according to claim 11, wherein the following level shift voltage associated with said threshold voltage $-V_{th}$ is generated between the gate and source of said first FET when the conductance $K_1$ of said first FET and the conductance $K_2$ of said second FET are set to a predetermined ratio $\beta = K_2/K_1$:

$$V_{GS1} = V_{th} + V_{th}(\sqrt{\beta+1})$$

13. A source-follower circuit comprising:
   (1) a first FET;
   (2) a second FET having the same conductivity type as that of said first FET and having substantially the same threshold voltage as that of said first FET;
   (3) a third FET having the same conductivity type as that of said first FET and having substantially the same threshold voltage as that of said first FET;
   wherein the drain of said third FET is connected to a first operating potential point, an input voltage is applied to the gate of said third FET and the source of said third FET is connected to the gate and drain of said first FET;
   wherein the souce of said first FET is connected to an output node and to the drain of said second FET;
   wherein the source of said second FET is connected to a second operating potential point;
   wherein said first FET operates in its saturation region, its gate and drain being connected electrically;
   wherein said second FET operates in its saturation region, a control voltage $V_c$ being applied to its gate and source;
   wherein said third FET operates in its saturation region; and
   wherein the following level shift voltage associated with said threshold voltage $V_{th}$ occurs between the gate and source of said first FET when the conductance $K_1$ of said first FET and the conductance $K_2$ of said second FET is set to a predetermined ratio $\beta = K_2/K_1$:

$$V_{GS1} = \sqrt{V_c} + (1-\sqrt{\beta})V_{th}$$

14. A source-follower circuit according to claim 13, wherein the conductance of said third FET is set to a substantially equal value to that of said second FET.

15. A source-follower circuit according to claim 14, wherein said first, second and thid FETs are enhancement mode FETs.

16. A source-follower circuit according to claim 14, wherein said conductance ratio of said first and second FETs is set so that the level shift voltage obtained between the drain and source of said first FET is some multiples of said threshold voltage.

17. A semiconductor circuit comprising:
   (1) a first FET;
   (2) a second FET having the same conductivity type as that of said first FET and having substantially the same threshold voltage as that of said first FET;
   (3) a third FET having the same conductivity type as that of said first FET and having substantially the same threshold voltage as that of said first FET;
   (4) constant voltage generation means for generating a constant voltage kept substantially stable from the output terminal thereof, having one and the other end thereof connected to first and second operating potential points, respectively; and
   (5) a constant current FET having the same conductivity type as that of said first FET, having substantially the same threshold voltage as that of said first FET and having the source thereof connected to said second operating potential point;
   wherein the drain of said third FET is connected to said first operating potential point, said constant voltage is applied to the gate of said third FET and the source of said third FET is connected to the gate and drain of said first FET;
   wherein the source of said first FET is connected to the gate of said constant current FET and to the drain of said second FET;
   wherein the source of said second FET is connected to said second operating potential point;
   wherein said first FET operates in its saturation region, its gate and drain being connected electrically;
   wherein said second FET operates in its saturation region, a control voltage being applied between its gate and source;
   wherein said third FET operates in its saturation region; and
   wherein the conductances of said first, second and third FETs are set so that the current flowing through the drain of said constant current FET is set substantially irrespective of said threshold voltage.

18. A semiconductor circuit according to claim 17, wherein the conductance of said third FET is set to a value substantially equal to that of said second FET.

19. A semiconductor circuit according to claim 18, wherein said first, second and third FETs and said constant current FET are enhancement mode FETs.

20. A semiconductor circuit according to claim 19, wherein said conductance ratio of said first and second FETs is set so that the level shift voltage obtained between the drain and source of said first FET is some multiples of said threshold voltage.

21. A semiconductor circuit comprising:
   (1) a first FET;
   (2) a second FET having the same conductivity type as that of said first FET and having substantially the same threshold voltage as that of said first FET;
   (3) constant voltage generation means for generating a constant voltage kept substantially stable from the output terminal thereof, having one and the other end thereof connected to first and second and second operating potential points, respectively; and
   (4) a constant current FET having the same conductivity type as that of said first FET, having substantially the same threshold voltage as that of said first FET and having the source thereof connected to said second operating potential point;
   wherein the drain of said first FET is connected to said first operating potential point, said constant voltage is applied to the gate of said first FET and the source of said first FET is connected to the gate of said constant current FET and to the drain of said second FET;
   wherein the source of said second FET is connected to said second operating potential point;
   wherein said first FET operates in its saturation region, said constant voltage being aplied to the gate of said first FET;

wherein said second FET operates in its saturation region, its gate and source being connected electrically; and wherein the conductances of said first and second FETs are set so that the current flowing through the drain of said constant current FET is set substantially irrespective of said threshold voltage.

22. A semiconductor circuit according to claim 21, wherein said first and second FETs are depletion mode FETs.

23. A semiconductor circuit according to claim 22, wherein said conductance ratio between said first and second FETs is set so that the voltage obtained between the drain and source of said first FET is a predetermined multiple of said threshold voltage.

* * * * *